United States Patent [19]

Sharpe

[11] Patent Number: 4,686,385
[45] Date of Patent: Aug. 11, 1987

[54] WAVEFORM CONVERTER CIRCUIT

[75] Inventor: Robin Sharpe, Carshalton, England

[73] Assignee: U.S. Philips Corporation, New York, N.Y.

[21] Appl. No.: 597,297

[22] Filed: Apr. 6, 1984

[30] Foreign Application Priority Data

Apr. 29, 1983 [GB] United Kingdom ............... 8311762

[51] Int. Cl.⁴ .............................................. H03K 5/08
[52] U.S. Cl. .................................. 307/261; 307/555; 328/28; 333/173
[58] Field of Search ............... 307/261, 268, 259, 546, 307/547, 551, 552, 555; 333/173, 540; 328/13, 28, 21, 22; 330/69

[56] References Cited

U.S. PATENT DOCUMENTS

| | | | |
|---|---|---|---|
| 3,936,755 | 2/1976 | Sheng | 307/359 |
| 4,161,693 | 7/1979 | Carlson | 330/69 |
| 4,446,438 | 5/1984 | Chang et al. | 333/173 |
| 4,527,133 | 7/1985 | Money | 307/261 |
| 4,574,206 | 3/1986 | Todokoro et al. | 307/268 |
| 4,588,905 | 5/1986 | Kojima | 307/268 |

FOREIGN PATENT DOCUMENTS 149416 8/1984 Japan .................................. 307/261

Primary Examiner—Stanley D. Miller
Assistant Examiner—Karl Ohralik
Attorney, Agent, or Firm—Thomas A. Briody

[57] ABSTRACT

A waveform converter circuit for producing an output square waveform, having a unity mark/space ratio, from an input sinusoidal waveform which can have a large peak-to-peak amplitude range and a large d.c. voltage level range. The circuit comprises a differential amplifier which receives the input waveform at the inverting input. The output of the amplifier is applied to a D-type flip-flop. The flip-flop Q-output is fed via a switched-capacitor filter to the inverting input to provide a corrected d.c. voltage level for the input waveform at this input. The flip-flop Q-output is fed via a switched-capacitor filter to the non-inverting input to provide a slicing level at this input. When the output square waveform has a 1 to 1 mark/space ratio, the corrected d.c. voltage level equals the slicing level. Thus, the circuit will respond to an input waveform with a small peak-to-peak amplitude in the presence of an initial large d.c. voltage level of the input waveform.

11 Claims, 10 Drawing Figures

WAVEFORM CONVERTER CIRCUIT

BACKGROUND OF THE INVENTION

This invention relates to a waveform converter circuit for obtaining at an output thereof a square waveform having the same frequency as a sinusoidal waveform applied to an input of the circuit, the square waveform also having a substantially unity mark/space ratio between two given amplitude levels for a range of peak-to-peak amplitude levels of the sinusoidal.

A waveform converter circuit of the above type has application, for example, in a circuit arrangement for recovering binary data transmitted by frequency shift using two tone signals of different frequencies which correspond, respectively, to binary '1' and '0' bits. Such a circuit arrangement can be used in a videotex terminal to receive binary data, representing display information, which is transmitted as tone signals from a data source to the terminal over a telephone line. Another possible use of the circuit arrangement is to receive binary data, which is supplied in the form of tone signals from an audio cassette tape player, into a home computer or other digitally operable apparatus.

The technique of binary data transmission by frequency shift using two tone signals is well known. Detection of the two tone signals in order to recover the binary '1' and '0' bits may involve, either counting over a period of time the number of pulses occurring in the square waveform at the output of the waveform converter circuit, or measuring the period between successive pulse of this square waveform. It is convenient to use the zero crossings of the square waveform for this counting or measuring. It is therefore important for the satisfactory recovery of the binary data that the square waveform has an accurate unity mark/space ratio, because deviation from this mark/space ratio will introduce variation into the count or measurement, The square waveform can be produced by amplitude-limiting, following slicing of the input sinusoidal waveform mid-way between positive and negative peaks. Because the peak-to-peak amplitude and also the actual d.c. voltage level of the sinusoidal waveform can vary, it is advantageous to make the slicing level adaptive so that it tends to remain at the mid-way setting automatically. It will be apparent that if the slicing level deviates from the mid-way setting, then deviation from the required unity mark/space ratio will result.

The adaptive control of the slicing level can be achieved by means of a corrective feedback signal derived from the output square waveform, this feedback signal being used to adjust the slicing level relative to the actual d.c. voltage level of the input sinusoidal waveform. This feedback signal usually needs to be filtered to remove any a.c. component at the output square waveform frequency from the feedback signal.

Thus, a specific form of waveform converter circuit of the above type can comprise a differential amplifier having a first (e.g. non-inverting) input connected to receive the input sinusoidal waveform, a second (inverting) input connected to receive a feedback signal which defines a switching level, and an output at which the output square waveform is produced, the circuit also including a low-pass filter connected between the amplifier output and said second input, the output square waveform being fed to the low-pass filter which performs both an integrating and a filtering function, the filtered output signal constituting said feedback signal.

For an integrated circuit implementation of this specific form of waveform converter circuit, for a particular application thereof, consideration has been given to forming the integrating low pass filter as a switched-capacitor filter using ratioed capacitors. However, because of the excessively large capacitor ratios which would be required, firstly to filter a.c. components of relatively low frequency and, secondly, to provide a feedback signal over a dynamic range compatible with relatively large d.c. voltage level and peak-to-peak amplitude ranges of the input sinusoidal waveform, such an implementation has been found to be impracticable.

SUMMARY OF THE INVENTION

It is an object of the present invention to provide a waveform converter circuit of the above type wich overcomes this difficulty.

According to the invention, a waveform converter circuit of the above type, comprises a differential amplifier having a first input connected to receive an input sinusoidal waveform, and a second input connected to receive from first filter means a first feedback signal which defines a slicing level, by and a second filter means from which a second feedback signal is to be applied to said first input, said second feedback signal defining for the input sinusoidal waveform at the amplifier first input, a d.c. voltage level which is maintained at substantially the same value as that of the slicing level at the amplifier second nput, one of said feedback signals being proportional, and the other inversely proportional, to the mark/space ratio of the square output waveform.

In a waveform converter circuit according to the present invention, there is thus provided a second feedback signal which acts to move the d.c. voltage level of the input sinusoidal waveform as originally received, towards the slicing level as defined by the first feedback signal. This is, in effect, a dual adaptive control of the slicing level relative to the original d.c. voltage level of the input waveform. Since the d.c. voltage level fo the input waveform at the amplifier first input is maintained at substantially the same value as that of the slicing level at the amplifier second input, small peak-to-peak amplitudes of the input waveform can be sensed in the presence of a high original d.c. voltage level of the input waveform.

In carrying out the invention, there is preferably provided a coupling capacitor via which the input sinusoidal waveform is to be applied to the amplifier first input. This coupling capacitor allows d.c. isolation between the input of the circuit at which the input waveform is received and the output from the second filter means from which the second feedback signal is produced.

As there is now no longer any necessity for the slicing level to alter appreciably in value in order to cater for large changes in d.c. voltage level of the sinusoidal input waveform, it becomes feasible to implement the first and second filter means as respective switched-capacitor filters, using ratioed capacitors, in an integrated circuit implementation of the waveform converter circuit.

A preferred embodiment of waveform converter circuit according to the invention includes a D-type flip-flop having a data input connected to the output of the differential amplifier, and inverting and non-inverting data outputs, one of which is connected to the input of the first filter means and the other of which is connected to the input of second filter means. This D-type flip-flop provides a convenient way of inputting the filter means with waveforms from which the feedback signals which are proportional and inversely proportional, respectively, to the square output waveforms are derived by the filter means. Suitably, the waveform at the flip-flop non-inverting data output constitutes the output square waveform.

Preferably, the first and second filter means, implemented as switched-capacitor filters, are switched at a clock rate which is the same as that used to switch the D-type flip-flop. This gives coherent switching in that filter breakthrough of spurious signals at the clock frequency is unlikely to occur.

Each switched-capacitor filter may comprise first and second pairs of ratioed sample-and-hold capacitors, together with first and second switching means which are operable alternately in response to 2-phase clock pulses, the sample capacitor of the first pair being alternately connected by said first switching means to the (relevant) data output of the D-type flip-flop and to the hold capacitor of the pair, and the sample capacitor of the second pair being alternately connected by said second switching means to the hold capacitor of the first pair and to the hold capacitor of the second pair, the voltage on the latter capacitor determining the (relevant) feedback signal.

The coupling capacitor can serve as the hold capacitor of the second ratioed capacitor pair of the second switched-capacitor filter.

The first and second switching means may be MOS-field effect transistors,

DESCRIPTION OF THE DRAWINGS

In order that the invention may be more fully understood reference will now be made by way of example to the accompanying drawings, of which.

DESCRIPTION OF THE PREFERRED EMBODIMENT

Figure 1:
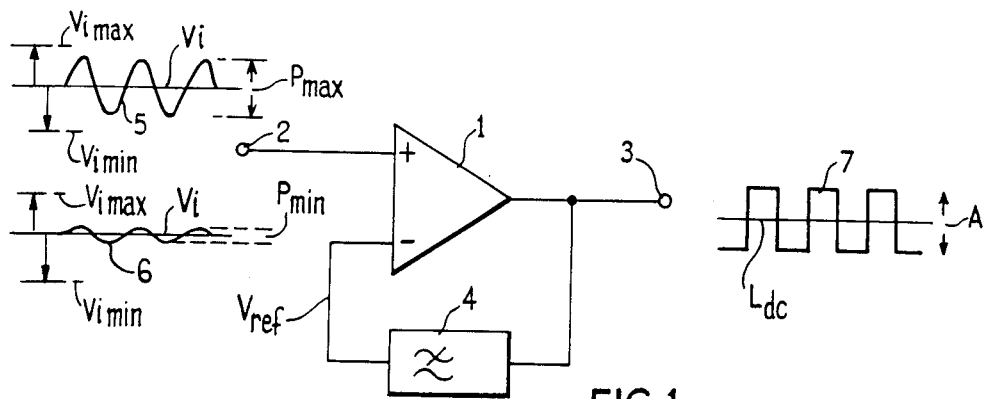
FIG. 1 shows a basic known form of waveform converter circuit.

Referring to the drawings, the basic known form of waveform converter circuit shown in FIG. 1 comprises a differential amplifier 1 having its non-inverting input (+) connected to an input terminal 2, and its output connected an output terminal 3, and also via a low-pass filter 4 to its inverting input (−). An input sinusoidal waveform to be applied to the input terminal 2 may have a peak-to-peak amplitude range between maximum and minimum values $P_{max}$, $P_{min}$ as illustrated by the input waveforms 5 and 6 in FIG. 1. In response to an applied input waveform, the differential amplifier 1 is required to produce a square output waveform 7 having a substantially unity mark/space ratio and a substantially constant amplitude A. The mean d.c. voltage level $L_{dc}$ of the square output waveform 7 constitutes a reference voltage $V_{ref}$ at the inverting input (−) of the differential amplifier 1, due to the integrating action of the low-pass filter 4. The filter 4 also removes the a.c. component at the square output waveform frequency from this reference voltage $V_{ref}$. This reference voltage $V_{ref}$ is effectively a switching level for the differential amplifier 1 which should be set mid-way between the peak-to-peak amplitude of the input waveform in order to achieve the unity mark/space ratio. However, the d.c. voltage level of the sinusoidal input waveform (5,6) may vary between maximum and minimum values $Vi_{max}$ and $Vi_{min}$, in addition to the variation in the peak-to-peak amplitude of this input waveform. Therefore, the dynamic response of the differential amplifier 1 has to be appropriate for effecting amplitude limiting of the input waveform for a given range of its d.c. voltage level as well as for a given range of this peak-to-peak amplitude variation. The mean d.c. voltage level $L_{dc}$ of the output waveform 7 will tend to alter whenever the unity mark/space ratio of this output waveform 7 is departed from. This departure will be due to a change in the d.c. voltage level of the input waveform (5,6) as a result of which the reference voltage $V_{ref}$ is no longer set mid-way between the peak-to-peak amplitude thereof. The alteration of the mean d.c. voltage level $L_{dc}$ will alter the reference voltage $V_{ref}$ in a corrective sense so that it tends towards the required mid-way setting again, when the unity mark/space ratio of the output waveform will be resumed. However, in practice, only relatively small changes in the d.c. voltage level can be catered for.

Figure 2:
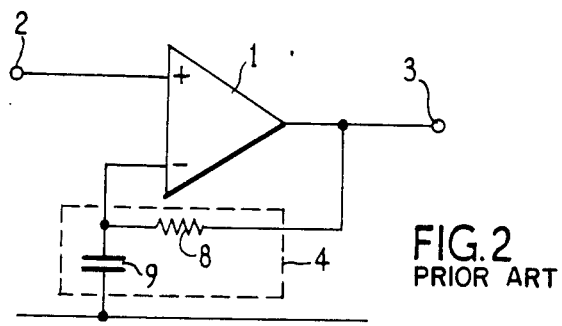
FIG. 2 shows the circuit of FIG. 1 with an RC filter.
Figure 3:
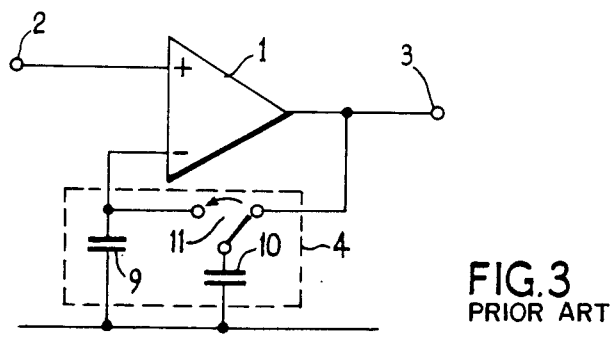
FIG. 3 shows the circuit of FIG. 1 with a switched-capacitor filter.
Figure 4:
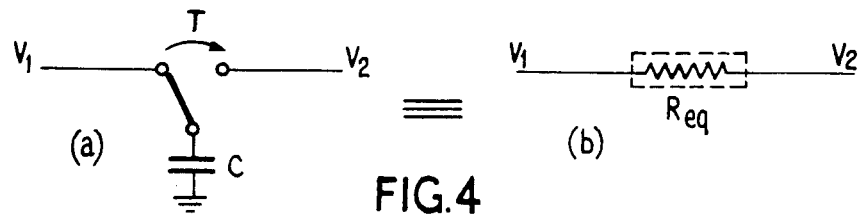
FIG. 4 illustrates the basic switched-capacitor principle.

As shown in FIG. 2, the low-pass filter 4 may be a simple RC filter comprising a resistance 8 and a capacitance 9. For an integrated circuit implementation of the circuit shown in FIG. 2, consideration has been given to replacing the resistance 8 by a switched-capacitor element comprising, as shown in FIG. 3, a capacitor 10 and an electronic switch 11. Briefly, the basic principle of this switched-capacitor element can be demonstrated by considering, with reference to FIG. 4, the resistive charge transfer action of a periodically switched capacitor. The circuit elements (a) and (b) in FIG. 4 are entirely equivalent electrically, and the charge transferred in one period T in each element gives: $(V1-V2) \cdot C = [(V1-V2)/R_{eq}] \cdot T$; so that $R_{eq} = T/C$. Therefore, the low-pass filter 4 can be designed solely in terms of the ratios of the capacitors 9 and 10, and the sampling (switching) rate of the switch 11.

However, for a specific application of a waveform converter circuit of the type in issue, the peak-to-peak amplitude range of the input waveform is to be 20 mV to 2 V (i.e. an input signal dynamic range of 40 dB from −41 dBm to −1 dBm) for an input waveform frequency of 1300 Hz. Also, the input waveform can have a d.c. voltage level of 5 volts, ±1 volt. It can be shown that for this application the capacitor ratio 9/10 (FIG. 3) for a switched-capacitor implementation of the filter 4 would have to be approximately 20000:1, which is not realizable in a practical integrated circuit. Therefore, a waveform converter circuit in accordance with the invention was devised which is suitable for this specific application and in which capacitor ratios of only 900:1 can be achieved.

Figure 5:
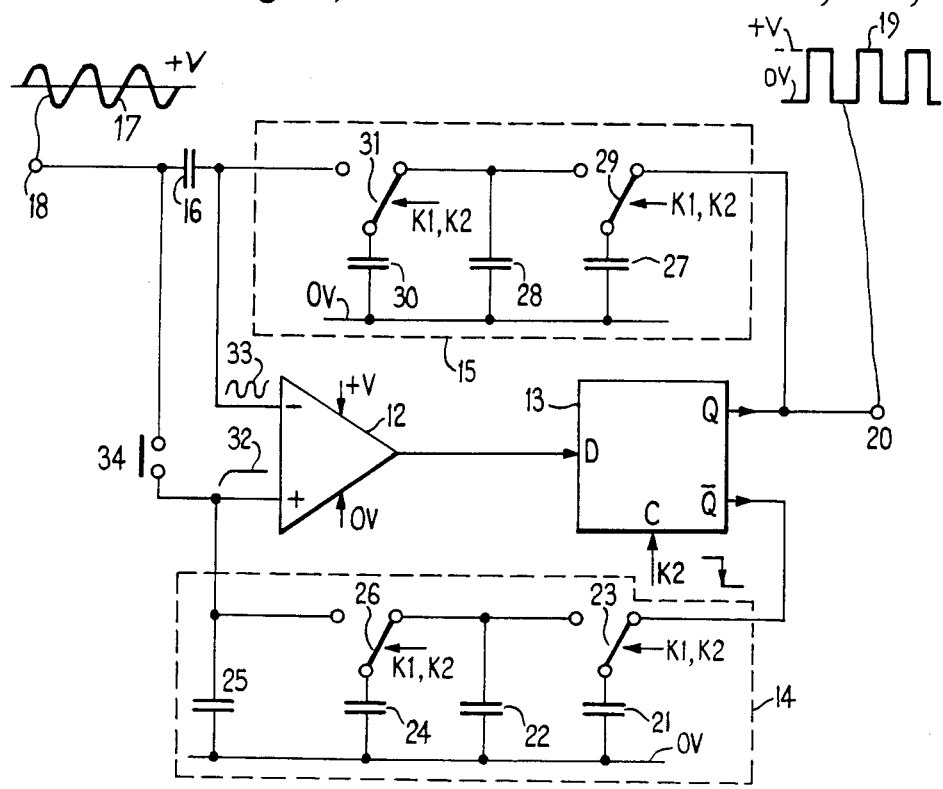
FIG. 5 shows a waveform converter circuit conforming to the invention.

The particular embodiment of waveform converter circuit shown in FIG. 5 comprises a differential amplifier 12, a D-type flip-flop 13, and two switched-capacitor filters 14 and 15. There is also provided an input coupling capacitor 16 which effectively forms part of the filter 15. In response to an input sinusoidal waveform 17 applied to an input terminal 18, the circuit produces an output square waveform 19 having a substantially unity mark/space ratio at an output terminal 20.

More specifically, the flip-flop 13 has a data input D connected to the output of the differential amplifier 12, a non-inverting data output Q connected to the output terminal 20 and to the filter 15, an inverting data output $\overline{Q}$ connected to the filter 14, and a clock input C connected to receive clock pulses K2. The flip-flop 13 is driven by the negative-going edge of each clock pulse K2 in that the logic level (high or low) that is present at the data input D when this edge occurs is produced at the data output Q, while the inverse logic level is produced at the data output $\overline{Q}$. The data output levels are then held until the next clock pulse edge, when they are maintained or reversed as determined by the prevailing data input level. The high and low logic levels are +V and 0 V, respectively, and the output square waveform 19 alternates between these two logic levels.

The filter 14 comprises a sample capacitor 21 and a hold capacitor 22 which form a first pair of ratioed capacitors with an associated charge transfer switch 23, and a sample capacitor 24 and a hold capacitor 25 which form a second pair of ratioed capacitors with an associated charge transfer switch 26. The filter 15 comprises a sample capacitor 27 and a hold capacitor 28 which form a first pair of ratioed capacitors with an associated charge transfer switch 29, and also a second sample capacitor 30 which together with the coupling capacitor 16 form a second ratioed capacitor pair. A charge transfer switch 31 is associated with this latter ratioed capacitor pair.

The differential amplifier 12 functions as a comparator in that it will produce at its output the high logic level +V when the potential at its non-inverting input (+) is higher than the potential at its inverting input (−): when the input potentials are the other way round, the low logic level 0V will be produced at the amplifier output.

For the operation of the circuit, the assumed initial d.c. voltage level (for the input waveform 17 to be applied to the circuit) is the high logic level +V which can be considered to be analog ground. Therefore, when the circuit is initially energized, the high logic level +V will be applied to the amplifier inverting input (−) due to the absence of charge on the coupling capacitor 16. The low logic level 0 V will be applied to the amplifier non-inverting input (+) via the capacitor 25, which is also uncharged at this time. As a consequence, the low logic level 0V will be applied to the flip-flop D-input from the amplifier output. The low logic level 0 V at the flip-flop Q-output is applied to the filter 15 and the high logic level +V at the flip-flop $\overline{Q}$-output is applied to the filter 14. These filters 14 and 15 are switched periodically by 2-phase clock pulses K1 and K2 at the same clock rate as that used to drive the flip-flop 13. The voltage appearing at the output of the filter 14 causes the capacitor 25 to charge progressively in a sense which progressively increases the potential at the amplifier non-inverting input (+) from the low logic level 0 V towards the high logic level +V. Conversely, the voltage appearing at the output of the filter 15 causes the capacitor 16 to charge progressively in a sense which progessively decreases the potential at the amplifier inverting input (−) from the high logic level +V towards the low logic level 0 V. Once the potential at the non-inverting input (+) becomes higher than the potential at the inverting input (−), the amplifier output will change from low logic level OV to high logic level +V, so that the logic levels at the flip-flop Q-output and $\overline{Q}$-output will be reversed. It can be seen that the overall effect of this operation is an adaptive adjustment which maintains both the amplifier inputs (+), (−) at substantially the same potential.

The final potential at the amplifier non-inverting input (+) serves as a reference potential 32 which can be adjusted in value adaptively by the feedback path including the filter 14. When the input waveform 17 is applied to the circuit at the analog ground level +V, the resulting level-adjusted waveform 33 which is applied at the amplifier inverting input (−) will cause the amplifier output to alternate between the high and low logic levels, as the reference potential is exceeded and not exceeded for successive half cycles of this waveform 33.

Since the reference potential 32 lies mid-way between the peak-to-peak amplitude of the waveform 33, the resulting square waveform 19 at the flip-flop Q-output will have a substantially unity mark/space ratio.

Any change in the d.c. voltage level of the input waveform 17 from analog ground will be compensated for rapidly by adaptive correction of both the reference potential 32 and the d.c. voltage level of the level-adjusted waveform 33, to maintain the reference potential 32 at its mid-way setting.

Figure 6:
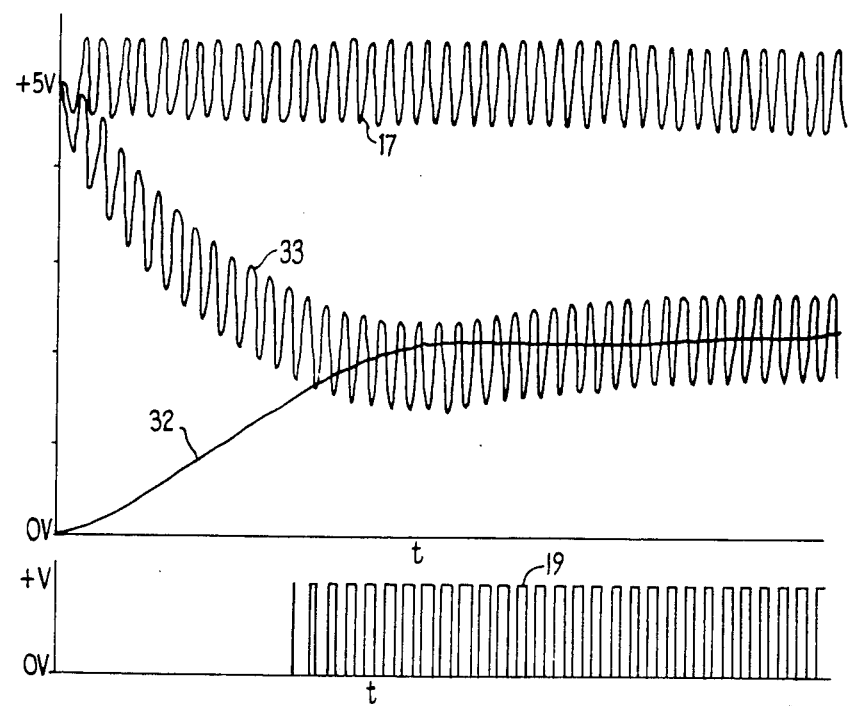
FIGS. 6 to 8 show different response waveforms for the circuit of FIG. 5.
Figure 7:
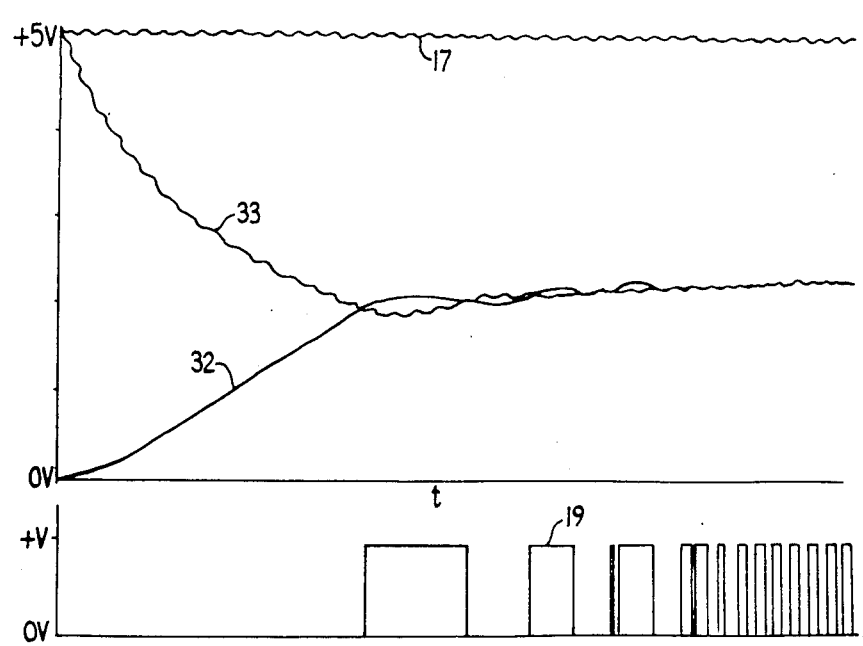
Figure 8:
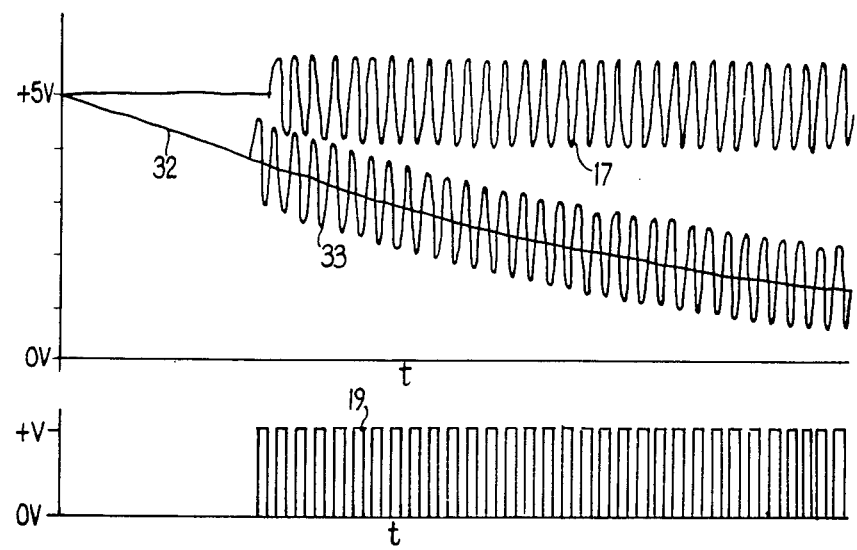

FIGS. 6 to 8 show different response waveforms for the circuit of FIG. 5. In FIG. 6, there is shown the applied input waveform 17 with a peak-to-peak amplitude of 1 volt and a d.c. voltage level (analog ground) of +5 volts which is the high logic level. The resulting waveform 33 has a d.c. voltage level which progessively decreases until it reaches approximately +2½ volts, which is the level also attained by the reference potential 32. It can be seen that once the reference potential 32 is at this mid-way setting of the waveform 33, the square output waveform 19 has substantially a unity mark/space ratio. In FIG. 7, there is shown the applied input waveform 17 with a peak-to-peak amplitude of only 0.1 volt. In this instance, the initial overshoot of the potentials of the resulting waveform 33 and the reference potential 32 has a more significant effect on the initial mark/space ratio of the square output waveform 19, but it can be seen that this mark/space ratio quickly settles to unity as a result of the dual adaptive correction.

As a possible modification to the circuit of FIG. 5, the reference potential 32 can be initially at the high logic level +V. This can be achieved by pre-charging the capacitor 25 when the circuit is initially energized. For this purpose, a short-circuit switch 34 can be provided which is operated for a few milliseconds. The effect of this modification on the various waveforms is shown in FIG. 8. The reference potential 32 is now immediately set mid-way between the peak-to-peak amplitude of the resulting waveform 33, so that the square input waveform 19 has the unity mark/space ratio almost at the outset.

Figure 9:
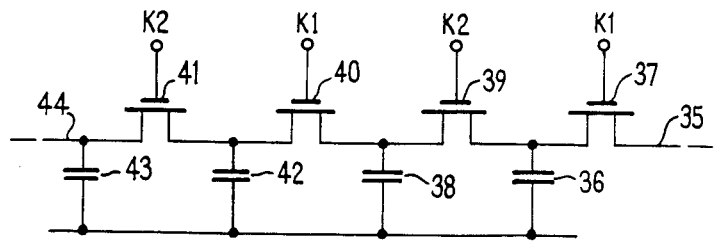
FIG. 9 shows a simple switched-capacitor circuit.
Figure 10:
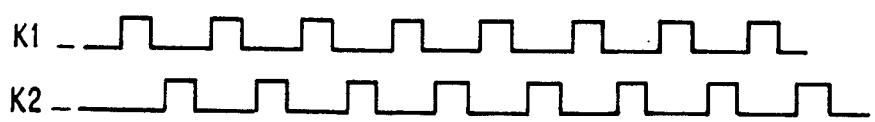
FIG. 10 shows 2-phase clock pulses for the circuit of FIG. 9.

In each of the filters 14 and 15 the two pairs of ratioed capacitors can take the form shown in FIG. 9. In this Figure, the potential at an input 35 produces charge on a sample capacitor 36 during the period that a field-effect transistor 37 is rendered conductive by a clock pulse K1. (FIG. 10). The charge on the sample capacitor 36 is then transferred to a hold capacitor 38 during the period that a field-effect transistor 39 is rendered conductive by a clock pulse K2 (FIG. 10) which is of a later phase than the clock pulse K1. Two further field-effect transistors 40 and 41 are rendered conductive by the clock pulses K1 and K2, respectively. The charge on the capacitor 38 is transferred to a capacitor 42 when the transistor 40 is conductive and the charge on the capacitor 42 is transferred to a capacitor 43 when the transistor 41 is rendered conductive. The charge on the capacitor 43 provides an output potential on an output 44.

I claim:

1. A waveform converter circuit for obtaining a square waveform having the same frequency as a sinusoidal waveform applied to an input of the circuit, the square waveform also having a substantially unity mark space ratio between two given amplitude levels for a range of peak-to-peak amplitude levels of the sinusoidal waveform, said converter circuit comprising a differential amplifier having a first input connected to the input of the converter circuit for receiving said sinusoidal waveform, a second input for receiving a first reference signal, and an output connected to an input of a flip-flop having inverting and non-inverting data outputs, and first and second clocked switched capacitor filter means said first filter means coupled between one output of said flip-flop and said second input of said differential amplifier for providing said first reference signal, and said second filter means coupled between the other output of said flip-flop and the first input of said differential amplifier for combining a second reference signal with said sinusoidal waveform, said second reference signal establishing a direct voltage level for the sinusoidal waveform which is maintained at substantially the same value as said first reference signal, one of said reference signals being proportional, and the other inversely proportional, to the mark/space ratio of the output square waveform.

2. The waveform converter circuit of claim 1 wherein said differential amplifier first input is an inverting input, and said second input is a non-inverting input.

3. A waveform converter circuit as claimed in claim 1, wherein said flip-flop is D-type and wherein said inverting data output of said flip-flop is connected to the input of said first filter means and said non-inverting data output is connected to the input of said second filter means.

4. A waveform converter circuit as claimed in claim 3, wherein the waveform at the flip-flop non-inverting data output constitutes the square waveform.

5. A waveform converter circuit as claimed in claim 3 or 4, wherein said first and second filter means are switched-capacitor filters comprising ratioed capacitors, and wherein each switched-capacitor filter comprises first and second pairs of ratioed sample-and-hold capacitors, together with first and second switching means which are operable, alternately, in response to 2-phase clock pulses, the sample capacitor of the first pair being alternately connected by said first switching means to a data output of said D-type flip-flop and to the hold capacitor of the pair, and the sample capacitor of the second pair being alternately connected by said second switching means to the hold capacitor of the first pair and to the hold capacitor of the second pair, the voltage on the latter capacitor determining one of the feedback signals.

6. A waveform converter circuit as claimed in claim 3 or 4, wherein said first and second switched-capacitor filters use ratioed capacitors, switched at a clock rate which is the same as that used to switch the D-type flip-flop.

7. A waveform converter circuit as claimed in claim 5, characterized in that the first and second switching means are implemented as MOS-field effect transistors.

8. A waveform converter circuit as claimed in claim 5 further comprising a coupling capacitor via which the input sinusoidal waveform is applied to the amplifier first input, wherein said coupling capacitor serves as the hold capacitor of the second ratioed capacitor pair of said second switched-capacitor filter.

9. A waveform converter circuit as claimed in claim 7 further comprising a coupling capacitor via which the input sinusoidal waveform is applied to the amplified first input, wherein said coupling capacitor serves as the hold capacitor of the second ratioed capacitor pair of said second switched-capcitor filter.

10. A waveform converter circuit as claimed in claim 1, 3 or 4, wherein said first and second filter means are switched-capacitor filters, further comprising ratioed capacitors.

11. A waveform converter circuit as claimed in claim 1, 3 or 4, further comprising a coupling capacitor via which the input sinusoidal waveform is applied to said amplifier first input.

* * * * *